(12) United States Patent
Yoon

(10) Patent No.: US 7,741,915 B2
(45) Date of Patent: Jun. 22, 2010

(54) POWER AMPLIFICATION APPARATUS IN COMMUNICATION SYSTEM

(75) Inventor: Jin-Ho Yoon, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 3 days.

(21) Appl. No.: 11/961,335

(22) Filed: Dec. 20, 2007

(65) Prior Publication Data

US 2008/0150639 A1 Jun. 26, 2008

(30) Foreign Application Priority Data

Dec. 21, 2006 (KR) .................... 10-2006-0131797

(51) Int. Cl.
*H03F 3/04* (2006.01)
(52) U.S. Cl. ....................... 330/298; 330/68
(58) Field of Classification Search .................. 330/68, 330/298
See application file for complete search history.

(56) References Cited

U.S. PATENT DOCUMENTS 7,277,065 B2 * 10/2007 Wu et al. .................. 343/909
2003/0080836 A1 5/2003 Nagaishi et al.

* cited by examiner

*Primary Examiner*—Robert Pascal
*Assistant Examiner*—Khiem D Nguyen
(74) *Attorney, Agent, or Firm*—The Farrell Law Firm, LLP (57) ABSTRACT

Disclosed is a power amplification apparatus in a communication system. The apparatus includes a high power amplifier for amplifying an input signal; and a lattice panel, one surface of which is in contact with a ground plane of the high power amplifier, the one surface including a first line and a second line. The first line has at least two first etched portions and at least one first copperplate portion, the first copperplate portion being positioned between the first etched portions, and the first copperplate portion being formed at an interval of $$\frac{\lambda_0}{4},$$

and the second line has at least two second etched portions and at least one second copperplate portion, the second copperplate portion being positioned between the second etched portions, and the second copperplate portion being formed at an interval of $$\frac{\lambda'_0}{4}.$$

6 Claims, 5 Drawing Sheets

POWER AMPLIFICATION APPARATUS IN COMMUNICATION SYSTEM

PRIORITY

This application claims priority under 35 U.S.C. §119(a) to a Korean Patent Application filed in the Korean Intellectual Property Office on Dec. 21, 2006 and assigned Serial No. 2006-131797, the contents of which are incorporated herein by reference.

BACKGROUND OF THE INVENTION

1. Field of the Invention

The present invention relates to a communication system, and more particularly to a power amplification apparatus in a communication system.

2. Description of the Related Art

Currently, in a mobile communication system, power amplifiers are disposed at final output parts of base stations (BSs) and mobile stations (MSs), so as to amplify an input signal of a low level, for example, a baseband signal, to an output signal of a high level, for example, a radio frequency (RF) band signal. When a power amplifier is nonlinear, the RF signal has a distorted signal component. Such nonlinearity of the power amplifier reduces the gain of an input signal, and generates a frequency component due to inter-modulation, in addition to the input frequency component. The frequency component generated by inter-modulation exerts an influence on adjacent channels, thereby degrading the entire capacity of the system. Therefore, linearity is a very important factor in the power amplifier.

For this reason, the power amplifier uses a linearization circuit of a feedforward scheme in order to satisfy the linearity. Since the degree of linearization by the linearization circuit is very high, the linearization circuit can satisfy the linearization specification required for a base station amplifier.

Figure 1:
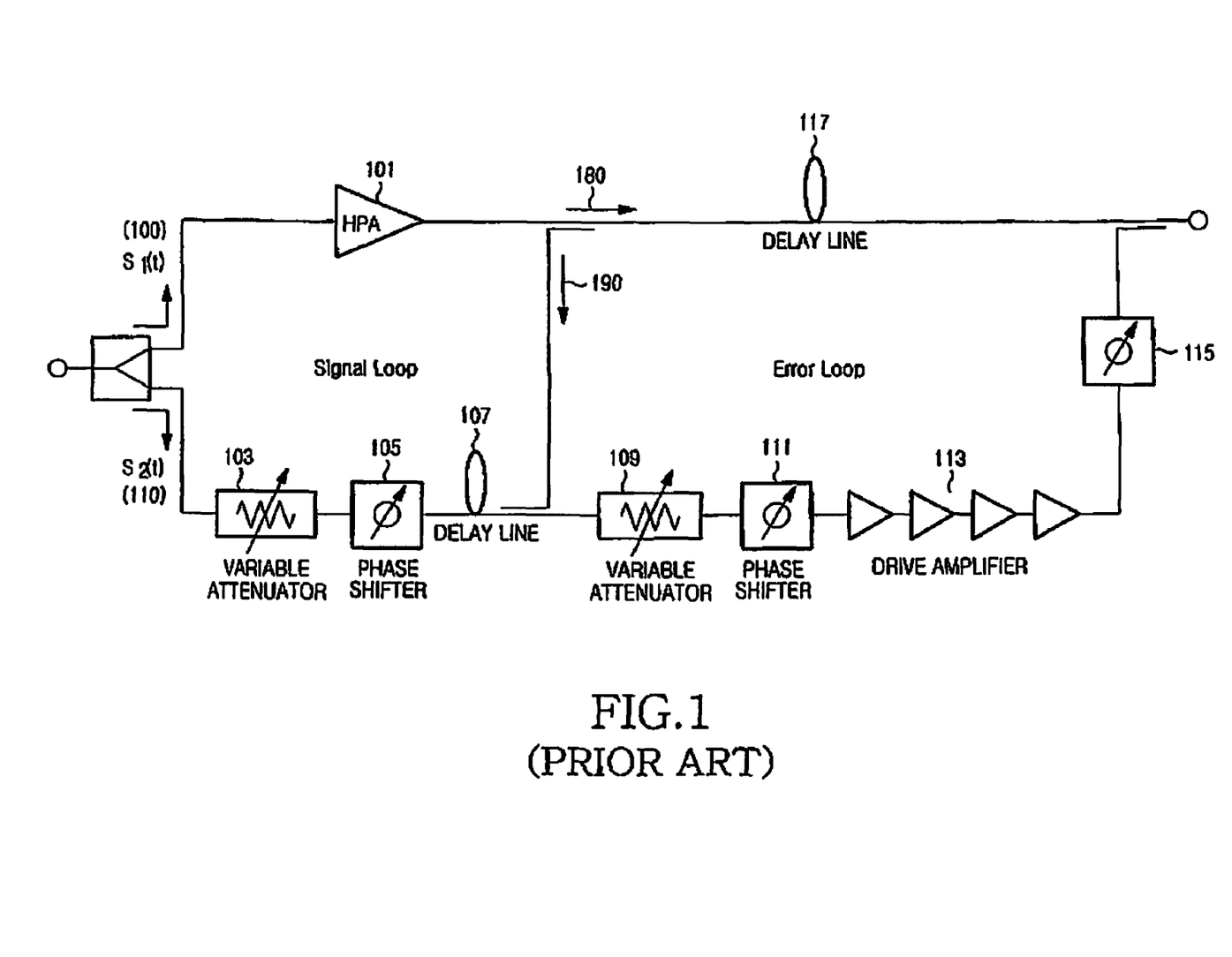
FIG. 1 is a block diagram illustrating the operation principle of a conventional power amplifier using a feedforward scheme.

FIG. 1 is a block diagram illustrating the operation principle of a conventional power amplifier using a feedforward scheme.

The power amplifier includes a high power amplifier (HPA) 101 for amplifying a low-level input signal to a high-level output signal r, variable attenuators 103 and 109, phase shifters 105, 111 and 115, an error amplifier (i.e. drive amplifier) 113 for detecting and amplifying error of a signal, and delay lines 107 and 117 for delaying an input signal for a predetermined period of time and outputting the signal without any change in the waveform thereof.

The basic operation of the power amplifier using the feedforward scheme is described as follows. First, an original signal S to be amplified is divided into two equal signals $S_1(t)$ and $S_2(t)$. The signal $S_1(t)$ 100 passes through the HPA 101. In order for the HPA 101 to accurately amplify a signal, it is necessary for input and output signals of the HPA 101 to coincide with each other. However, the input and output signals may not coincide with each other due to distortion, noise or the like, generated by the nonlinearity of an element or frequency, so that a noise frequency signal N may be generated. Accordingly, when the signal $S_1(t)$ 100 passes through the HPA 101, a noise frequency signal N is generated alongside the original signal S, thereby generating an output signal of S+N.

Meanwhile, the signal $S_2(t)$ passes through the variable attenuator 103 and the phase shifter 105. When the signal $S_2(t)$ passes through the variable attenuator 103 and the phase shifter 105, the signal $S_2(t)$ is converted into signal S', which has the same power of the signal $S_2(t)$ but with a phase inverted by 180 degrees, and then the signal S' is transferred to the delay line 107.

Also, the composite signal S+N of the signal $S_1(t)$ 100 and the noise frequency signal N, is divided into two equal signals 180 and 190, in which signal 180 is transferred to the delay line 117.

The other signal S+N 190 and the signal S' inverted from the $S_2(t)$ meet, so that the signals S and S' cancel each other with only the noise frequency signal N remains. The noise frequency signal N further passes through the variable attenuator 109 and the phase shifter 111, and is amplified by the drive amplifier 113. The amplified noise frequency signal N passes to the phase shifter 115, in which the phase of the amplified noise frequency signal N is inverted by 180 degrees, thereby generating an inverted noise frequency signal N'.

As a result, the signal S+N 180 passed through the delay line 117 and the inverted noise frequency signal N' meet, so that the noise frequency signals N and N' cancel each other, with only the original signal S remaining.

As described above, an amplifier using a linearization circuit of a feedforward scheme requires various modules, such as a variable attenuator, a drive amplifier, a phase shifter, etc., to remove an additionally generated noise frequency signal, thereby degrading the efficiency of the amplifier. Therefore, it is necessary to develop a method to enhance the efficiency of an amplifier.

SUMMARY OF THE INVENTION

Accordingly, the present invention has been made to solve the above-mentioned problem occurring in the prior art. The present invention provides a power amplification apparatus for enhancing the efficiency of a power amplifier in a communication system.

In accordance with an aspect of the present invention, there is provided a power amplification apparatus in a communication system, the apparatus includes a high power amplifier for amplifying an input signal and a lattice panel, one surface of which being in contact with a ground plane of the high power amplifier, the one surface including a first line and a second line, wherein the first line includes at least two first etched portions and at least one first copperplate portion, the first copperplate portion being positioned between the first etched portions, and the first copperplate portion being formed at an interval of $$\frac{\lambda_0}{4},$$

and the second line includes at least two second etched portions and at least one second copperplate portion, the second copperplate portion being positioned between the second etched portions, and the second copperplate portion being formed at an interval of $$\frac{\lambda'_0}{4}.$$

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF THE EXEMPLARY EMBODIMENT

Hereinafter, an exemplary embodiment of the present invention will be described with reference to the accompanying drawings. In the following description, detailed description of known functions and configurations incorporated herein will be omitted when it may obscure the subject matter of the present invention. Terms described in the following description are defined by taking functions thereof into consideration, therefore their definitions may vary according to users, operator's intention, or custom. Accordingly, the terms must be defined based on the entire contents of the present application.

In order to enhance the efficiency of a power amplifier, the present invention provides a new lattice structure having intervals of $$\frac{\lambda_0}{4}$$

and proposes a power amplification apparatus in which a lattice panel having the new lattice structure is grounded to the ground plane G of the power amplification apparatus.

Figure 2:
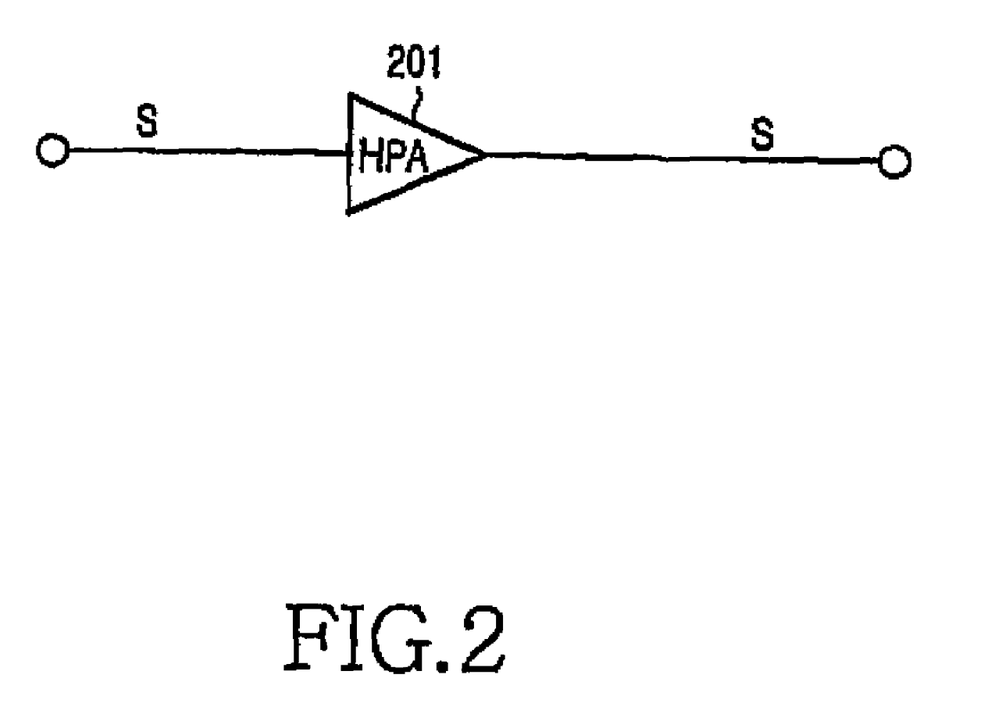
FIG. 2 is a diagram explaining the operation principle of a power amplification apparatus according to an exemplary embodiment of the present invention.

FIG. 2 is a diagram showing the operation principle of the power amplification apparatus according to an exemplary embodiment of the present invention.

First, an original signal S to be amplified is input to a high power amplifier (HPA) 201. As opposed to the HPA 101 shown in FIG. 1, the HPA 201 performs an amplification function with a lattice panel equipped on the ground plane of the HPA 201. Also, the lattice structure of the lattice panel grounded on the HPA 201 is designed to have intervals corresponding to noise frequency components to be blocked through the ground plane, e.g., intervals of $$\frac{\lambda_0}{4}$$

and $$\frac{\lambda'_0}{4}$$

with respect to the noise frequency.

The input signal S is amplified by the HPA 201, and a noise frequency component is removed by the lattice structure having the intervals of $$\frac{\lambda_0}{4}$$

and $$\frac{\lambda'_0}{4},$$

so that only an amplified original signal S is output.

Figure 3:
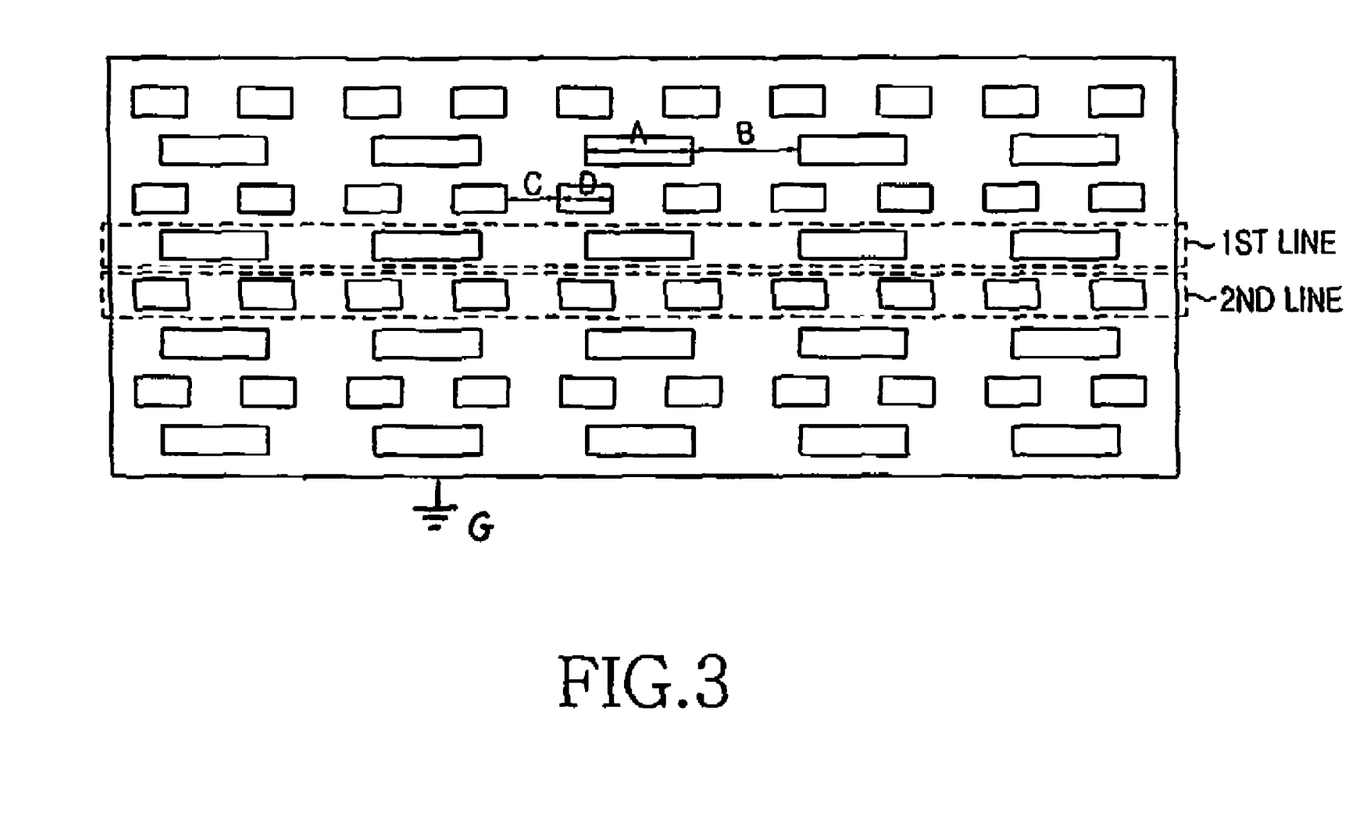
FIG. 3 is a diagram illustrating the structure of a lattice panel grounded on the ground plane according to an exemplary embodiment of the present invention.

FIG. 3 is a diagram illustrating the structure of a lattice panel grounded on the ground plane according to an exemplary embodiment of the present invention.

One surface of the lattice panel is in contact with the ground plane "G". Intervals "A" and "B" on the lattice panel are of the same length from one end to the other along a transmission line. The lattice structure having an interval of $$\frac{\lambda_0}{4}$$

with respect to a frequency is equipped on the ground plane "G" to block the noise frequency component. In addition, the intervals "C" and "D" on the lattice panel are of the same length from one end to the other along a transmission line. The lattice structure having an interval of $$\frac{\lambda'_0}{4}$$

with respect to a frequency is equipped on the ground plane "G" to block the noise frequency component.

Hereinafter, the portion where a lattice structure having an interval of $$\frac{\lambda_0}{4}$$

of the frequency in a serially repeated structure on the lattice panel will be referred to as a first line, and the portion where a lattice structure having an interval of $$\frac{\lambda'_0}{4}$$

of the frequency in a serially repeated structure will be referred to as a second line. The first line and the second line may be spaced apart from each other or in contact with each other.

Here, on the lattice panel, which is equipped on the ground plane "G" of an amplifier, the intervals "B" and "C" correspond to the existing ground plane (e.g. a copperplate made of copper) for making a lattice structure, i.e., a portion of copperplate, and the intervals "A" and "D" correspond to a portion from which the copperplate is removed by etching, i.e., an etched portion.

For example, the intervals of "A" and "B" may be 0.664 cm, which is $$\frac{\lambda_0}{4}$$

of 4.2 GHz, corresponding to a noise frequency to be blocked. Also, the intervals of "C" and "D" may be 0.40 cm, which is $$\frac{\lambda'_0}{4}$$

of another frequency of 6.3 GHz. The $$\frac{\lambda_0}{4}$$

corresponding to the interval of "A" or "B," and the $$\frac{\lambda'_0}{4}$$

corresponding to the interval of "C" or "D" may be equal to each other.

The intervals of $$\frac{\lambda_0}{4} \text{ and } \frac{\lambda'_0}{4}$$

are obtained by Equation (1) below.

$$\exp(i\beta z)\cos\left(\frac{2\pi}{\Lambda}z\right) = \frac{1}{2}\left\{\exp\left[-j\left(\beta-\frac{2\pi}{\Lambda}\right)z\right]+\exp\left[-j\left(\beta+\frac{2\pi}{\Lambda}\right)z\right]\right\} \quad (1)$$

First, with respect to the interval of $$\frac{\lambda_0}{4},$$

$\exp(-j\beta z)$ represents a spatial dependence, and $\beta$ represents a mode propagation constant. In addition, $\Lambda$ represents a period of a lattice, in which it is necessary to select a value of $\Lambda$ to satisfy a phase matching condition between $-\beta$ and $$\frac{\beta - 2\pi}{\Lambda},$$

wherein $-\beta$ is equal to $$\beta - \frac{2\pi}{\Lambda}$$

and $\Lambda$ is equal to $$\frac{\lambda_0}{2n_{mode}}.$$

Here, $\lambda_0$ represents a wavelength of an electric field in free space, and is equal to $$\frac{\lambda}{\sqrt{er}},$$

wherein "er" represents the dielectric constant of a substrate. $n_{mode}$ represents the mode phase constant of a propagated mode. In addition, $\lambda$ is equal to "c/f," and represents the wavelength of a frequency.

Meanwhile, with respect to the interval of $$\frac{\lambda'_0}{4},$$

$\exp(-j\beta z)$ represents a spatial dependence, and $\beta$ represents a mode propagation constant. In addition, $\Lambda$ represents a period of a lattice, in which it is necessary to select a value of $\Lambda$ to satisfy a phase matching condition between $-\beta$ and $$\frac{\beta - 2\pi}{\Lambda},$$

wherein $-\beta$ is equal to $$\beta - \frac{2\pi}{\Lambda}$$

and Λ is equal to $$\frac{\lambda'_0}{2n_{mode}}.$$

Here, $\lambda_0$ represents a wavelength of an electric field in free space, and is equal to $$\frac{\lambda}{\sqrt{er}},$$

wherein "er" represents the dielectric constant of a substrate. $n_{mode}$ represents the mode phase constant of a propagated mode. In addition, the λ corresponds to "c/f," and represents the wavelength of a frequency.

In more detail, for example, when the HPA amplifies two input signals $f_1$ and $f_2$, distortion signals (i.e. intermodulation distortion (IMD)) are generated in addition to the original signals, thereby outputting signals $2f_1-f_2$ and $2f_2-f_1$. In order to remove the distortion signals, for example, $2f_1$ and $2f_2$, which are noise frequency components, a lattice panel of a lattice structure having intervals $$\frac{\lambda_0}{4} \text{ and } \frac{\lambda'_0}{4}$$

of a frequency, which is obtained by Equation 1, is connected to the ground plane of the HPA. As a result, the noise frequency component is removed by the lattice structure, and only the original signals $f_1$ and $f_2$ are amplified and output.

Figure 4A:
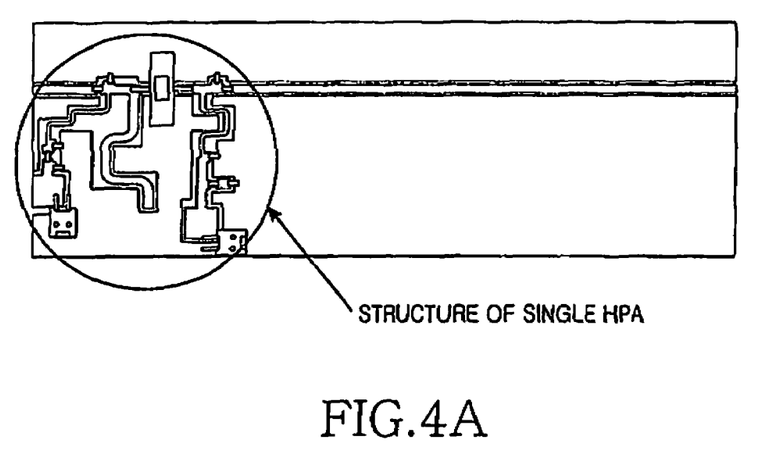
FIGS. 4A and 4B are diagrams illustrating the structure of an HPA according to an exemplary embodiment of the present invention.
Figure 4B:
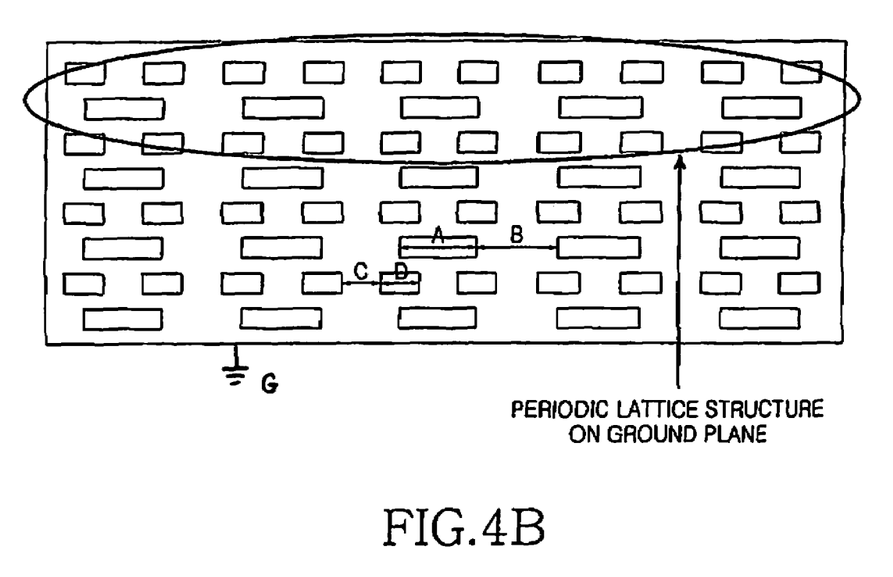

FIGS. 4A and 4B are diagrams illustrating the structure of an HPA according to an exemplary embodiment of the present invention.

FIG. 4A schematically illustrates the structure of an HPA for amplifying an input signal S without generating any noise frequency components. As opposed to the conventional technology, it is possible to satisfy linearity by amplifying an input signal without adding the linearization circuit described in FIG. 1.

FIG. 4B illustrates the structure of a lattice panel, which is grounded to the ground plane of an HPA, and has a lattice structure having intervals of $$\frac{\lambda_0}{4} \text{ and } \frac{\lambda'_0}{4}.$$

The lattice panel is in contact with the ground plane of HPA of FIG. 4A and functions to remove noise frequency components. That is, the lattice structure is designed in such a manner as to have a serially repeated structure for "A" and "B" and a serially repeated structure for "C" and "D" in order to determine a range of cut-off frequencies, and to have a paralleling extended repetition structure for a line of "A" and "B" and a line of "C" and "D" to remove noise frequency components in a wide range.

Figure 5:
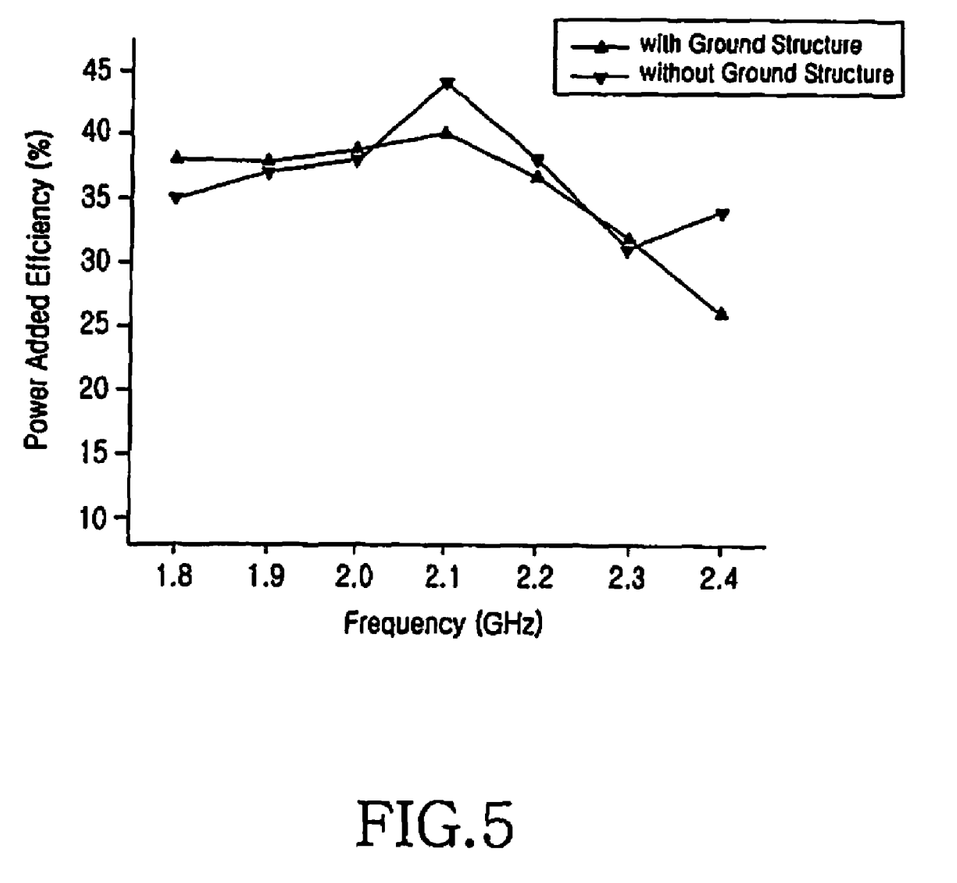
FIG. 5 is a graph illustrating a result of a simulation using the amplifier according to an exemplary embodiment of the present invention.

FIG. 5 is a graph illustrating a result of a simulation using an amplifier employing an exemplary embodiment of the present invention.

Referring to FIG. 5, it is shown that an HPA employing the lattice structure according to an exemplary embodiment of the present invention has a higher efficiency without using various modules employed to remove noise frequency components in the prior art.

As described above, according to the present invention, it is possible to remove noise frequency components in such a manner that the lattice panel having the lattice structure is in contact with the ground plane of the amplifier without using the modules employed to remove noise frequency components, thereby increasing the efficiency of the amplifier.

While the present invention has been shown and described with reference to certain exemplary embodiments thereof, it will be understood by those skilled in the art that various changes in form and details may be made therein without departing from the spirit and scope of the invention as defined by the appended claims. Accordingly, the scope of the invention is not to be limited by the above embodiments but by the claims and the equivalents thereof.

What is claimed is:

1. A power amplification apparatus in a communication system, the apparatus comprising:
    a ground plane for removing a noise frequency component; and
    a high power amplifier connected to the ground plane,
    wherein the ground plane has a parallel structure of alternately arranged first and second lattice structures, the first lattice structure comprising a plurality of first etched portions serially repeated on a copperplate at an interval of a first period, and the second lattice structure comprising a plurality of second etched portions serially repeated on the copperplate at an interval of a second period, and
    wherein the first period is $$\frac{\lambda_0}{4},$$

representing an interval of the noise frequency component generated from the high power amplifier, with $\lambda_0$ representing a wavelength of an electric field in free space defined by $$\lambda_0 = \frac{\lambda}{\sqrt{er}},$$

in which λ represents a wavelength of a frequency, and "er" represents a dielectric constant of a substrate.

2. The apparatus as claimed in claim 1, wherein the first lattice structures and the second lattice structures are spaced apart from each other.

3. The apparatus as claimed in claim 1, wherein the first lattice structures and the second lattice structures are in contact with each other.

4. The apparatus as claimed in claim 1, wherein the first period and the second period are equal to each other.

5. The apparatus as claimed in claim 1, wherein the first period and the second period are different from each other.

6. The apparatus as claimed in claim 1, wherein the second period is $$\frac{\lambda_0'}{4}$$

representing an interval of the noise frequency component generated from the high power amplifier, with $\lambda_0'$ representing a wavelength of an electric field in free space defined by $$\lambda_0' = \frac{\lambda}{\sqrt{er}},$$

in which $\lambda$ represents a wavelength of a frequency, and "er" represents a dielectric constant of a substrate.

* * * * *